United States Patent
Dietz et al.

(10) Patent No.: US 10,691,021 B2
(45) Date of Patent: Jun. 23, 2020

(54) APPARATUS AND METHOD FOR PRODUCING FLEXOGRAPHIC PRINTING PLATES

(71) Applicant: Flint Group Germany GmbH, Stuttgart (DE)

(72) Inventors: Gernot Dietz, Eisenberg (DE); Markus Mühlfeit, Weil der Stadt (DE); Frank Boyksen, Altdorf (DE)

(73) Assignee: Flint Group Germany GmbH (DE)

( * ) Notice: Subject to any disclaimer, the term of this patent is extended or adjusted under 35 U.S.C. 154(b) by 314 days.

(21) Appl. No.: 15/506,088

(22) PCT Filed: Aug. 27, 2015

(86) PCT No.: PCT/EP2015/069616
§ 371 (c)(1),
(2) Date: Feb. 23, 2017

(87) PCT Pub. No.: WO2016/030450
PCT Pub. Date: Mar. 3, 2016

(65) Prior Publication Data
US 2018/0217502 A1    Aug. 2, 2018

(30) Foreign Application Priority Data
Aug. 28, 2014    (EP) .................................... 14182579

(51) Int. Cl.
*G03F 7/30*    (2006.01)
*G03F 7/20*    (2006.01)
(Continued)

(52) U.S. Cl.
CPC .............. *G03F 7/3064* (2013.01); *B41C 1/00* (2013.01); *B41C 1/1008* (2013.01); *G03F 7/202* (2013.01);
(Continued)

(58) Field of Classification Search
None
See application file for complete search history.

(56) References Cited

U.S. PATENT DOCUMENTS 5,262,275 A    11/1993    Fan
5,552,262 A *   9/1996    Konermann ............. B41M 1/04
                                                        134/15
(Continued)

FOREIGN PATENT DOCUMENTS

DE    102010031527 A1    1/2012
EP        0819989 A1    1/1998
(Continued)

OTHER PUBLICATIONS

English translation of amended claims for PCT/EP2015/069616 as originally mailed to WIPO Jun. 24, 2016.
(Continued)

*Primary Examiner* — Joshua D Zimmerman
(74) *Attorney, Agent, or Firm* — Faegre Drinker Biddle & Reath LLP

(57) ABSTRACT

A device for producing flexographic printing plates starting from digitally imagable flexographic printing elements, with which at least the method steps of reverse exposure, main exposure, development using washout media, drying, and aftertreatment can be carried out in automated form, the device comprising at least two different transport devices with which the flexographic printing elements or plates, respectively, are transported through the device. A method for producing flexographic printing plates using said device.

23 Claims, 9 Drawing Sheets

Figure 1:
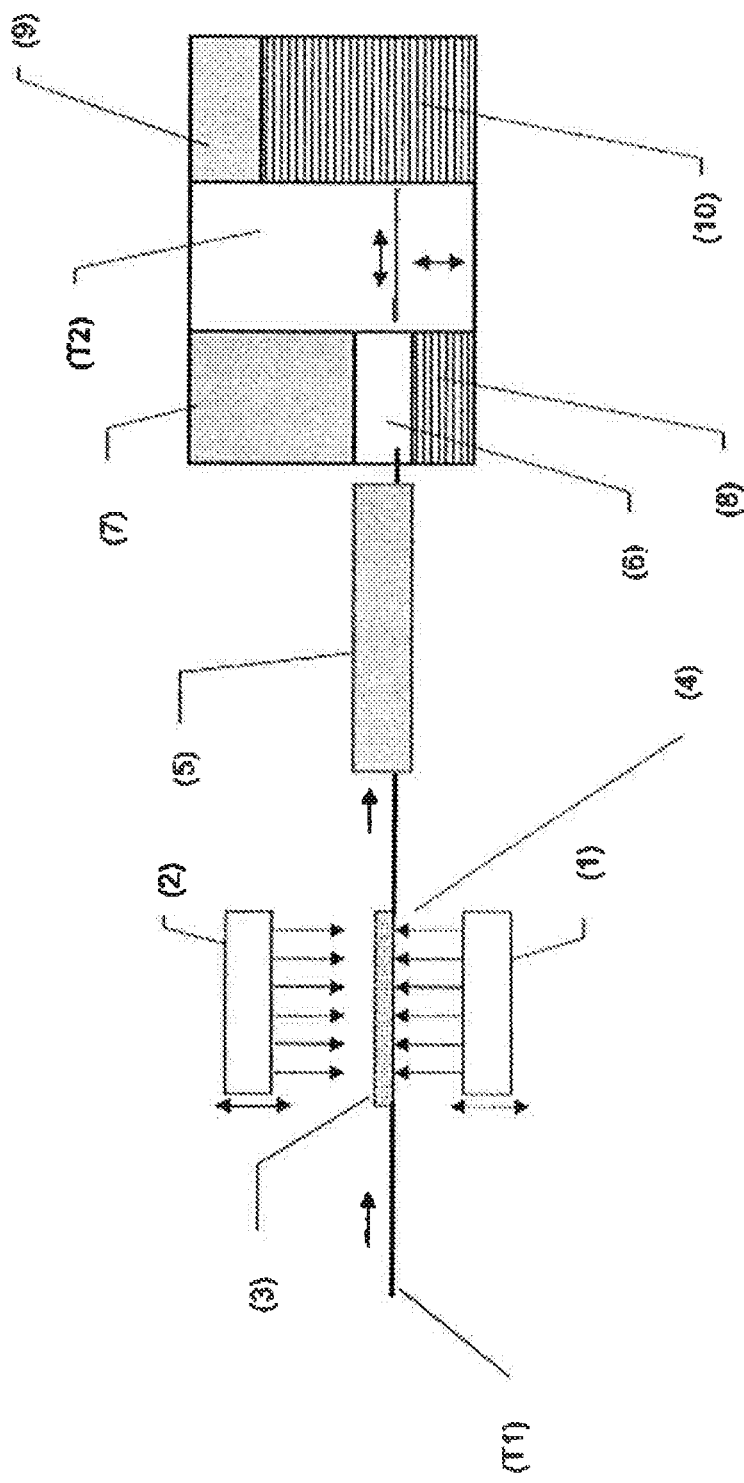

(51) Int. Cl.
*B41C 1/10* (2006.01)
*B41C 1/00* (2006.01)

(52) U.S. Cl.
CPC .......... *G03F 7/2004* (2013.01); *G03F 7/2022* (2013.01); *G03F 7/3057* (2013.01)

(56) References Cited

U.S. PATENT DOCUMENTS

| | | |
|---|---|---|
| 5,919,378 A | 7/1999 | Ferrante |
| 8,288,080 B2 | 10/2012 | Becker et al. |
| 8,685,624 B2 | 4/2014 | Döttinger et al. |
| 2013/0209939 A1 | 8/2013 | Recchia et al. |
| 2013/0242276 A1 | 9/2013 | Schadebrodt et al. |
| 2016/0207299 A1 | 7/2016 | Stebani et al. |

FOREIGN PATENT DOCUMENTS

| | | |
|---|---|---|
| EP | 1069475 A1 | 1/2001 |
| WO | WO-2008095994 A1 | 8/2008 |
| WO | WO-2009141256 A1 | 11/2009 |
| WO | WO-2012010459 A1 | 1/2012 |
| WO | WO-2012145111 A1 | 10/2012 |
| WO | WO-2013156942 A1 | 10/2013 |
| WO | WO-2015007667 A1 | 1/2015 |
| WO | WO-2015044437 A1 | 4/2015 |

OTHER PUBLICATIONS

International Preliminary Examination Report with Applicant amendments (in German) for PCT/EP2015/069616 dated Aug. 30, 2016.
International Search Report for PCT/EP2015/069616 dated Nov. 25, 2015.

\* cited by examiner

APPARATUS AND METHOD FOR PRODUCING FLEXOGRAPHIC PRINTING PLATES

CROSS-REFERENCE TO RELATED APPLICATIONS

This application is a national stage application (under 35 U.S.C. § 371) of PCT/EP2015/069616, filed Aug. 27, 2015, which claims benefit of European Application No. 14182579.4, filed Aug. 28, 2014, both of which are incorporated herein by reference in their entirety.

The present invention relates to a device for producing flexographic printing plates starting from digitally imagable flexographic printing elements, with which at least the method steps of reverse exposure, main exposure, development using washout media, drying, and aftertreatment can be carried out in automated form, the device comprising at least two different transport devices with which the flexographic printing elements or plates, respectively, are transported through the device. The invention further relates to a method for producing flexographic printing plates using said device.

Digitally imagable flexographic printing elements are known in principle. They comprise at least one dimensionally stable support, a photopolymerizable layer, and a digitally imagable layer. The digitally imagable layer may be, for example, a laser-ablatable layer, a layer which can be written using inkjet printers, or a thermographic layer; the most commonplace are laser-ablatable layers, also called LAMS (laser-ablatable mask system) layers.

Starting from photopolymerizable, digitally imagable flexographic printing elements, flexographic printing plates are produced by means of a multistage operation, using corresponding devices for each method step.

First of all a mask is written into the digitally imagable layer, using an IR laser. This may involve laser apparatus with a rotating drum, flat bed apparatus, or internal drum lasers.

Following the writing of the mask, the flexographic printing element is exposed through the mask formed, with UV radiation or UV/VIS radiation. The photopolymerizable layer undergoes polymerization in the regions no longer concealed by the mask, while in the concealed regions there is no polymerization. UV exposure units used for this purpose may comprise various UV sources, examples being UV tubes or UV-LEDs.

Following exposure, the residues of the mask and also the unpolymerized fractions of the photopolymerizable layer are removed. This may be done using one or more solvents or else thermally. For washout by means of solvent, specialty washout equipment is used, examples being brush washers. For thermal development it is possible to use equipment in which an absorbent nonwoven web is pressed by a heated roller onto the exposed layer.

When solvents are used to develop the plate, there follows a drying step in a dryer, After the drying, the surface of the resulting flexographic printing plate is customarily aftertreated, by exposure of the surface with UVA and/or UVC radiation, for example. For this, again, corresponding exposure apparatus is used.

For the production of flexographic printing plates, the devices for implementing the respective method steps must be loaded manually with the flexographic printing element ahead of each method step. After the method step has been implemented, the processed flexographic printing element must be removed manually from the device and supplied to the subsequent method step in each case. On account of this repeated need for manual interventions in the method, the production of flexographic printing plates is costly and inconvenient.

There have therefore been proposals for devices which combine the implementation of different method steps with one another in one apparatus and hence reduce the number of manual interventions.

U.S. Pat. No. 5,919,378 discloses a device for the automated processing of exposed round flexographic printing plates by washout, drying, and aftertreatment. Exposure is not integrated into the device, but is instead performed by means of a separate device. Following exposure, the exposed round printing plates are loaded manually into the processing device described. The drying step takes place in a drying unit at 60° C.+/−2° C. The drying unit is equipped with a carousel into which the sleeves are hung and are moved on an oval track in the drying chamber. Heated air is blown through the drying chamber. The device additionally possesses a control unit to determine the drying time depending on the type of sleeves being used.

WO 2012/010459 A1 discloses a device for the in-line production of flexographic printing plates by means of a two-stage main exposure of photopolymerizable flexographic printing elements. The device possesses a first exposure unit for exposure with actinic light with an intensity $\geq 100$ mW/cm$^2$, composed of a plurality of UV-LEDs, and a second exposure unit for exposure with an intensity $<100$ mW/cm$^2$, having a radiation source other than UV-LEDs, preferably a UV tube. The device further comprises a washout unit and a drying unit, and also transport units which connect the units described to one another. Optionally there may also be a unit for the digital imaging of the flexographic printing elements, an aftertreatment unit, and a delivery unit for the flexographic printing plates obtained. Said transport units connect at least the two exposure units, the washout unit, and the drying unit. With regard to the transport units, only one embodiment is set out in more detail, namely that the flexographic printing elements or plates are moved through the entire system by means of a single transport device, such as by a transport belt or a transport strip, for example.

WO 2013/156942 A1 discloses a method and apparatus for the automated implementation of the exposure and the washout of photopolymerizable, digitally imagable flexographic printing elements. These flexographic printing elements are transported through the apparatus by means of a conveyor belt. The transport speed is governed by the washout parameters, or the washout speed. The exposure intensity is adapted in accordance with the transport speed. No drying step is described.

Our own earlier application EP 13186585.9 discloses a device for the in-line exposure of flexographic printing elements, allowing even flexographic printing elements differing in thickness to be exposed and washed out with satisfactory results. The device of the invention is used in methods for the processing of digitally imagable flexographic printing elements in plate form into flexographic printing plates. With the device of the invention it is possible to implement at least the method steps of reverse exposure, main exposure, and washout in an automated procedure. The device accordingly comprises at least one module for carrying out preliminary reverse exposure, one module for carrying out main exposure, and one module for washing out exposed flexographic printing elements. The device further comprises a transport unit, with which the flexographic elements are transported through the device, and a control unit. No drying step is described.

Factors to be taken into account when constructing processing systems that operate automatically include the factor that the individual processing steps proceed at different rates and that the time requirement is dependent on the nature of the flexographic printing element to be processed, and particularly on its thickness.

More particularly, the washout rate is very considerably dependent on the thickness of the relief-forming layer. For instance, exposed, thin flexographic printing elements can generally be washed out at speeds of up to 900 mm/min, whereas the washout speeds in the case of thick flexographic printing elements are considerably lower and, for example, only around 50 mm/min may be possible.

The rate-determining step in the production of flexographic printing plates, however, is the drying of the washed out flexographic printing plates. Exposure, washout, and aftertreatment generally take 10 to 20 minutes each. The drying is performed at around 60° C. to 65° C. for standard commercial flexographic printing plates, and the drying step takes at least 45 minutes up to 3 or 4 hours, depending on the type of plate used and on its thickness.

The long drying time—particularly for thick flexographic printing plates—is needed so that even residues of the high-boiling washout media are removed, as far as possible quantitatively, from the flexographic printing plate. It is self-evident that for plates of the same kind and a consistent temperature, the greater the layer thickness of the plate, the longer the drying time.

The drying rate can of course be raised in principle by increasing the drying temperature. In that case, however, the problem occurs that with standard commercial flexographic printing elements with PET support sheets, the register accuracy of the plates is impaired on heating to above 70° C., because the PET support sheets may shrink. In practice, therefore, this possibility for shortening the drying time is not available.

The problem scenario affecting the construction of automatic devices for producing flexographic printing plates, then, is that processing steps with significantly different time requirements must be combined with one another in the device.

It was an object of the invention to provide a device for the automated processing of photopolymerizable, digitally imagable flexographic printing elements into print-ready flexographic printing plates, said device allowing at least the method steps of reverse exposure, main exposure, development with washout media, drying, and aftertreatment to be carried out in an automated procedure, and also allowing the processing of different flexographic printing elements, more particularly flexographic printing elements differing in thickness.

Found accordingly has been a device for producing flexographic printing plates starting from digitally imagable flexographic printing elements comprising at least one dimensionally stable support sheet, a photopolymerizable, relief-forming layer, and a digitally imaged layer, comprising at least an exposure unit (1) for the preliminary exposure of the flexographic printing elements from the reverse by means of UV radiation, an exposure unit (2) for the main exposure of the flexographic printing elements by means of UV radiation through the digitally imaged layer, a washout unit (5) for removing the residues of the digitally imaged layer and also the unpolymerized fractions of the relief-forming layer, using washout media, a drying unit (7) for drying the washed out flexographic printing plates, an aftertreatment unit (9) for aftertreating the dried flexographic printing plates with UVA and/or UVC light, a storage unit (10) for accommodating the completed flexographic printing plates, a control unit (11) for control in the device, wherein the device comprises at least two different transport devices (T) for transporting the flexographic printing elements and flexographic printing plates, respectively, through the system.

In one embodiment, the device further comprises a unit for digital imaging that is disposed ahead of the exposure and preliminary reverse exposure unit in transport direction.

In one preferred embodiment of the invention, the device comprises at least one continuously operating transport device (T1), with which the flexographic printing elements are transported through the exposure units (1) and (2) and also the washout unit (5), and also a discontinuously operating transport device (T2), with which the washed out flexographic printing plates are transported into the drying unit (7), the aftertreatment unit (9), and also the storage unit (10), the flexographic printing plates being transferred from the transport device (T1) onto the transport device (T2) in a transfer unit (6).

Found additionally has been a method for producing flexographic printing plates using said device.

Index of figures:

FIG. 1 Diagrammatic representation of one embodiment of the device of the invention; preliminary reverse exposure and main exposure take place simultaneously.

Figure 2:
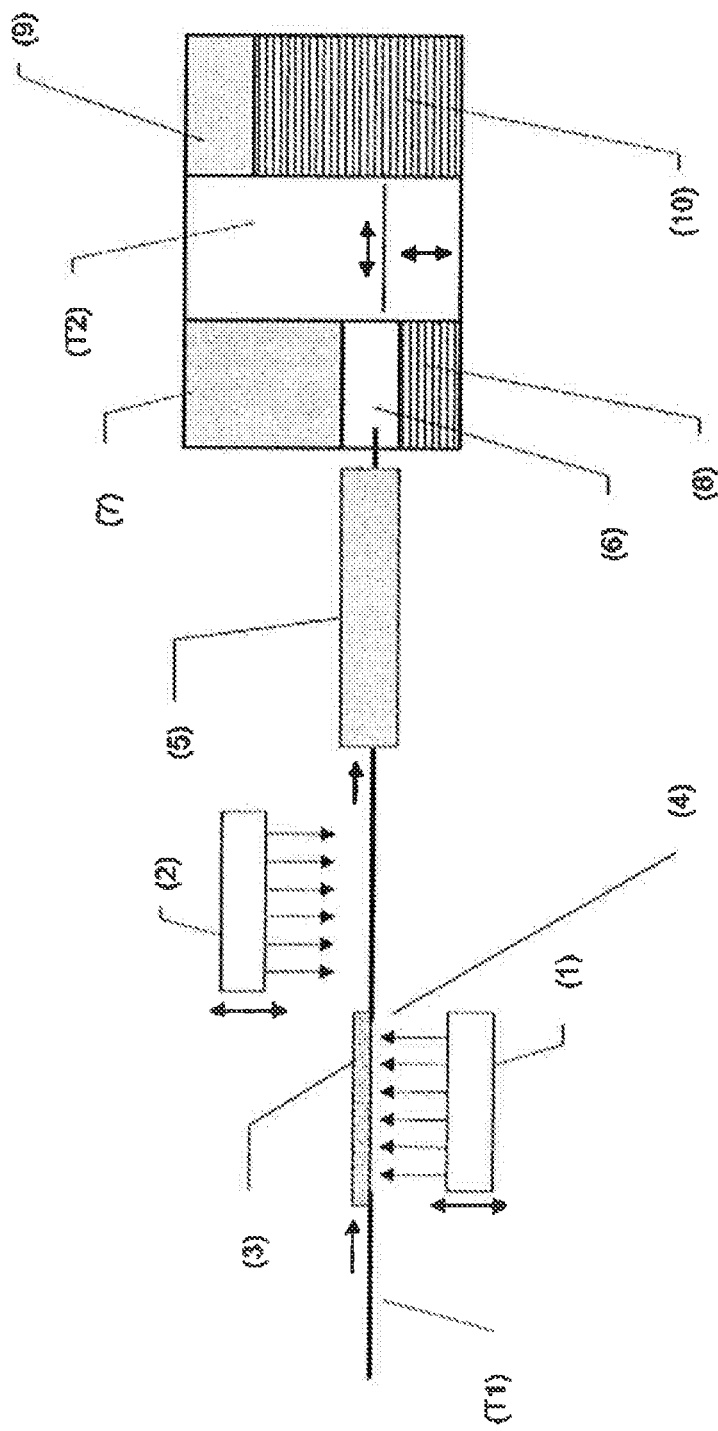

FIG. 2 Diagrammatic representation of another embodiment of the device of the invention; preliminary reverse exposure takes place first, and then main exposure.

Figure 3:
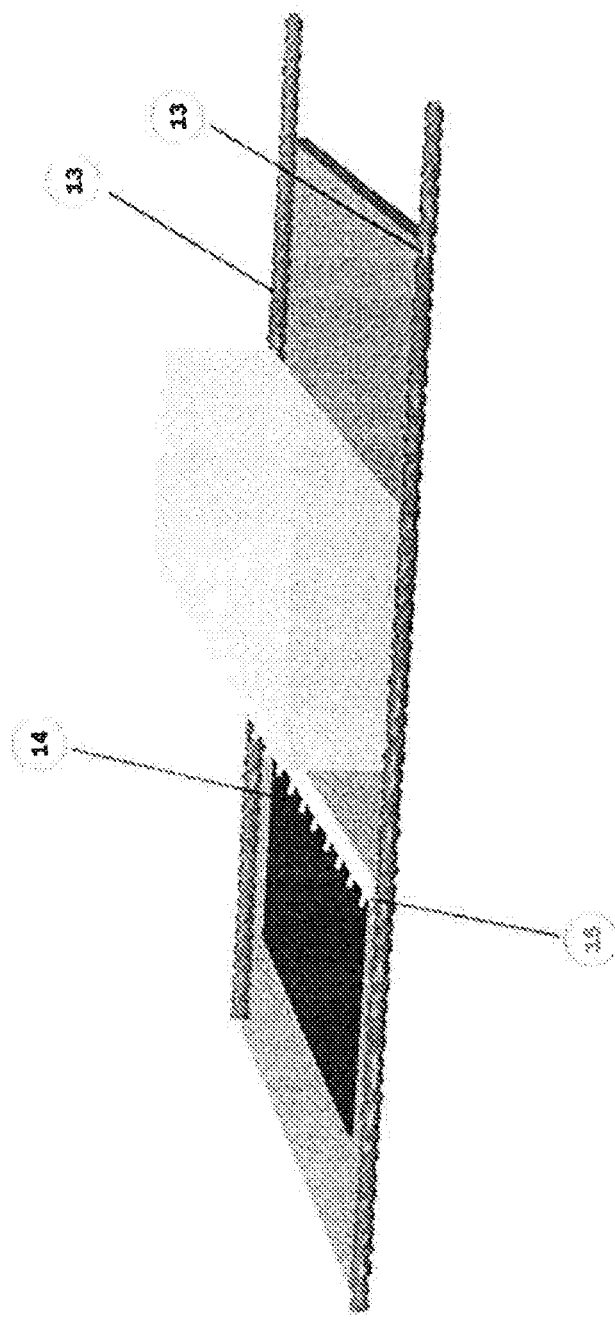

FIG. 3 Diagrammatic representation of one embodiment of the transport device T1.

Figure 4:
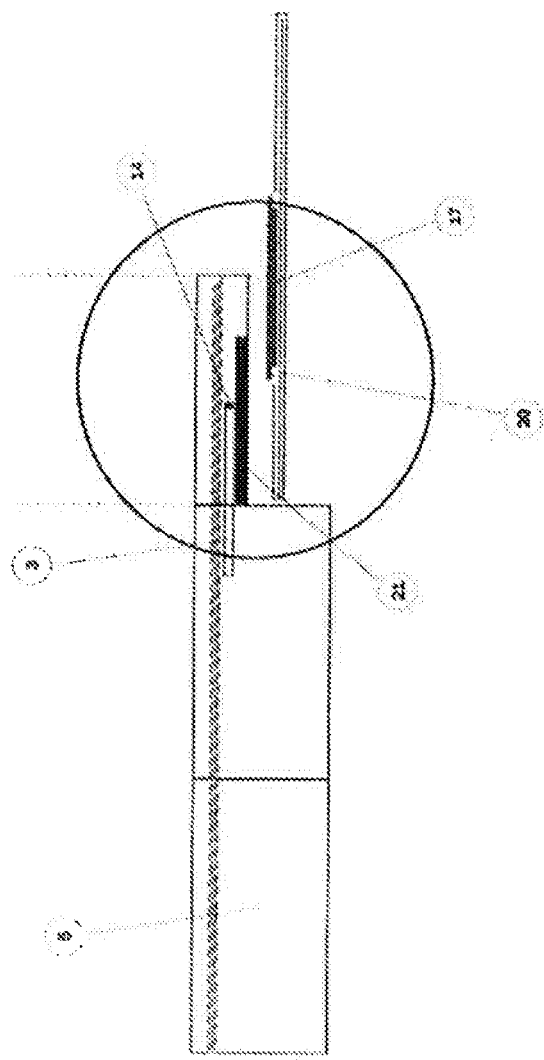

FIG. 4 Diagrammatic representation of one embodiment of the transfer unit (6).

Figure 5:
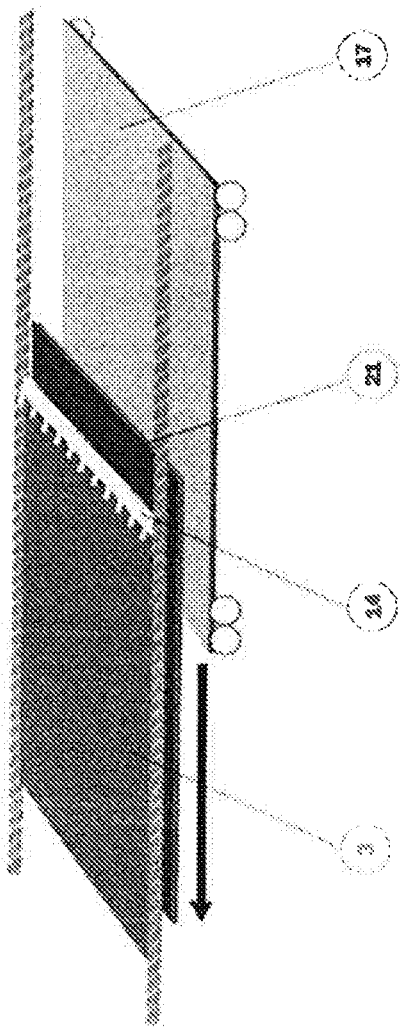

FIG. 5 Diagrammatic representation of one embodiment of the transfer unit (6).

Figure 6:
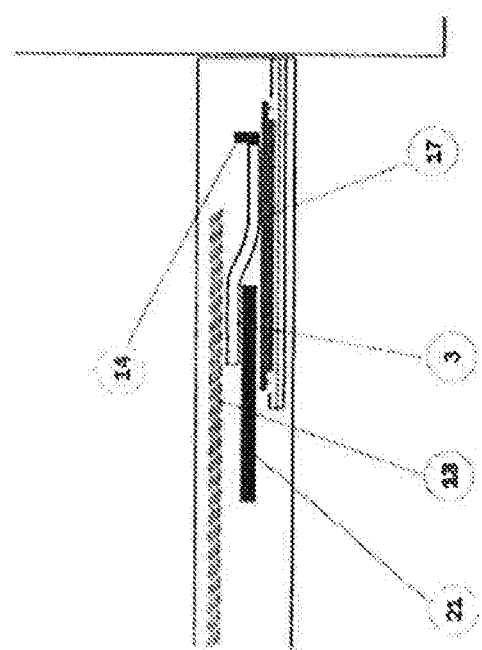

FIG. 6 Transfer of the plate in the transfer unit (6).

Figure 7:
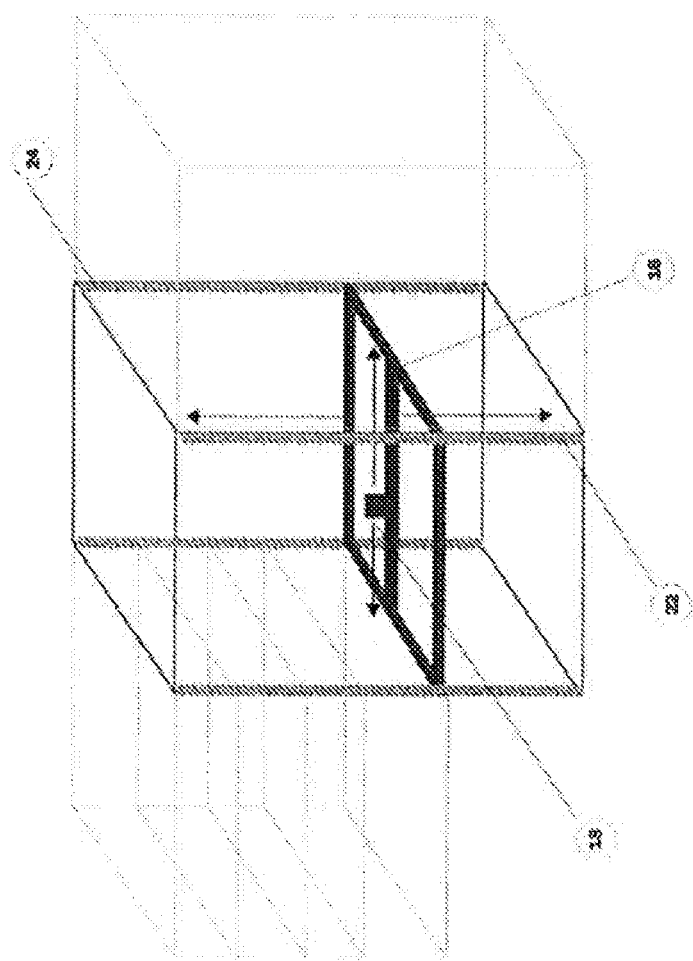

FIG. 7 Diagrammatic representation of one device implementation of the transport device (T2).

Figure 8:
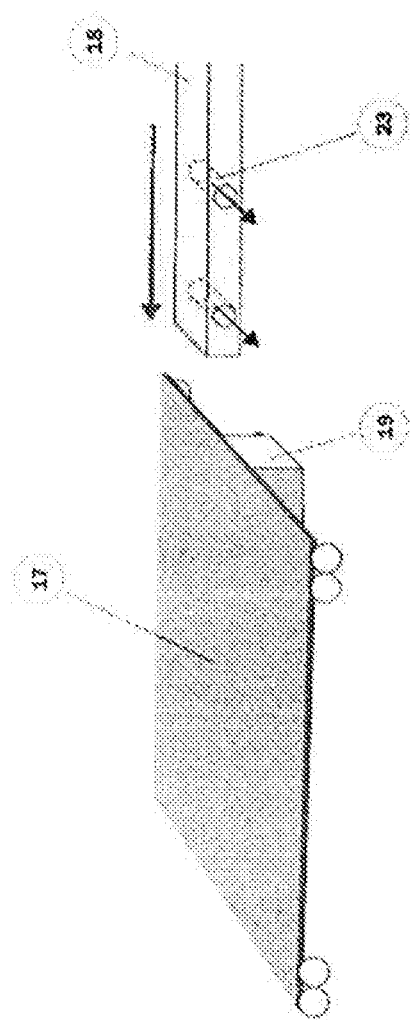

FIG. 8 Diagrammatic representation of one device implementation of the movable underlayer (17).

Figure 9:
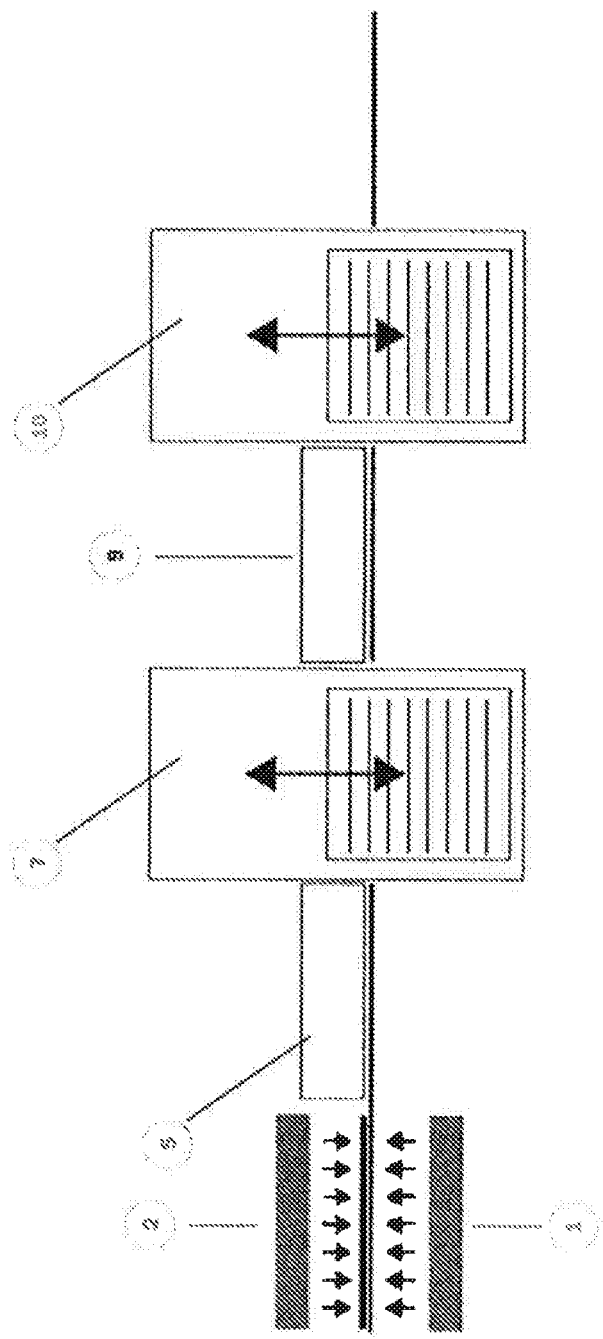

FIG. 9 Diagrammatic representation of another embodiment of the device of the invention; preliminary reverse exposure and main exposure take place simultaneously.

Regarding the invention, in detail, the following is observed:

In the text below, the terms "flexographic printing plate", "flexo plate", or "plate" are used for a printing forme which has already undergone crosslinking. The term "flexographic printing element" is used, as usual, for the photopolymerizable starting material which is used for producing flexographic printing plates.

DEVICE OF THE INVENTION

The device of the invention is used in methods for processing digitally imagable flexographic printing elements in plate form into flexographic printing plates, using washout media.

Digitally imagable flexographic printing elements in plate form are known in principle to the skilled person and are available commercially. Examples of such flexographic printing elements are described in U.S. Pat. No. 5,262,275, EP-A 1 069 475, WO 2008/095994 A1, WO 2009/141256 A1 or WO 2012/010459 A1, for example. The digitally imagable flexographic printing elements comprise at least one dimensionally stable support sheet, a relief-forming, photopolymerizable layer, preferably a relief-forming, photopolymerizable layer which can be washed out in organic washout media, and a digitally imagable layer, preferably a laser-ablatable mask layer. Where preliminary reverse exposure is envisaged, the support sheet ought to have at least a certain UV transparency. The elements, furthermore, may of course also comprise further layers, such as adhesive layers, oxygen barrier layers, or a protective sheet on the digitally imagable layer, for example.

The device of the invention allows automated implementation at least of the method steps of reverse exposure, main exposure, development using washout media, drying, and aftertreatment.

The device of the invention accordingly comprises at least
- an exposure unit (1) for the preliminary exposure of the flexographic printing elements from the reverse by means of UV radiation,
- an exposure unit (2) for the main exposure of the flexographic printing elements by means of UV radiation through the digitally imaged layer,
- a washout unit (5) for removing the residues of the digitally imaged layer and also the unpolymerized fractions of the relief-forming layer, using washout media,
- a drying unit (7) for drying the washed out flexographic printing plates,
- an aftertreatment unit (9) for aftertreating the dried flexographic printing plates with UVA and/or UVC light,
- a storage unit (10) for accommodating the completed flexographic printing plates, and
- a control unit (11) for control in the device.

The device may optionally further comprise a digital imaging unit disposed ahead of the exposure and preliminary reverse exposure unit in transport direction. This imaging unit may be, for example, a device for writing a mask into the digitally imagable layer by means of a laser—for example, it may be a flat bed laser.

Optionally it is also possible for there to be further units, examples being units for the automatic loading of the device of the invention with flexographic printing elements or for the automatic unloading of completed flexographic printing plates from the device.

In accordance with the invention the device comprises at least two different transport devices (T) for transporting the flexographic printing elements and plates, respectively, through the system. One transport device transports a flexographic printing element or plate from a processing unit to at least one further processing unit. One transport unit may of course also embrace transport between more than two processing units arranged one after another.

The transport devices (T) may be continuously or discontinuously operating transport devices.

The term "continuously" is intended to mean that the transport device transports the flexographic printing elements or plates through the device by means of a continuous movement, specifically also during the performance of the respective processing step, such as exposure or washout, for example, with the speed not having necessarily to be the same. The flexographic printing elements or plates during processing are therefore in motion owing to the action of the transport device.

Continuous transport devices may be, for example, transport belts or devices in which the flexographic printing elements and plates are drawn through the device by means of transport chains, spindles or the like.

The term "discontinuously" is intended to mean that the transport device transports the flexographic printing elements and plates from one to the next processing unit, but they are not moved by the transport device in the course of processing. This does not rule out the possibility that they are moved within the respective processing unit by a mechanism of the processing unit. For example, in the drying unit, flexographic printing plates may revolve in the drying chamber in the course of drying.

Discontinuous devices may be, for example, displaceable gripping devices or extendable and retractable gripping arms which push the flexographic printing elements and plates from one processing unit to the next.

Of course, continuous and discontinuous transport devices may be combined with one another. For example, the device may comprise a continuously operating transport device, with which the flexographic printing elements are transported through the exposure units (1) and (2) and also the washout unit (5), after which they are transported on by means of one or more discontinuous transport devices.

For processing in the described device of the invention, the already digitally imaged flexographic printing elements are introduced into a first transport device and, after processing in the device, the processed flexographic printing elements can be removed from the last transport device. The term "digitally imaged" means that a mask has already been written into the digitally imagable layer—in other words, the flexographic printing element is prepared for imagewise exposure.

If the device possesses a unit for digital imaging, digitally imagable flexographic printing elements are introduced into a first transport device and are initially supplied to a unit for digital imaging, and are then processed further.

FIRST PREFERRED EMBODIMENT

"Exposure—Washout" Module

In a first preferred embodiment, one of the devices (T) is a continuously operating transport device (T1) with which the flexographic printing elements are transported through the exposure units (1) and (2) and also the washout unit (5).

FIGS. 1 and 2 show overall views of two devices of the invention each possessing a continuous transport device (T1).

One embodiment of the transport device (T1) is represented diagrammatically in FIG. 3.

The transport device (T1) represented comprises two transport elements (13) which extend parallel to one another at a distance a from one another in transport direction. These elements may be, for example, rotating transport chains, rotating toothed belts, or rotating spindles, each driven by a suitable drive unit.

The transport device (T1) further comprises transport strips (14) with a length of at least a. The transport strips may be placed onto the two transport elements, perpendicularly relative to the two transport elements, by their respective ends (15) and are moved in transport direction by the transport elements, by means of suitable catches.

The nature of the catches depends on the nature of the transport elements. Where the elements are chains or toothed belts, then catches, pins for example, can be arranged each in opposite pairs. Where the transport elements are spindles, the catches may then be arranged in the lateral ends of the transport strips.

The distance a from one another limits the maximum width of the flexographic printing elements which can be processed with the device of the invention. Flexographic printing elements for processing can be narrower, but not wider, than the distance a.

The transport device (T1) may additionally have a base disposed between the two transport elements, with the flexographic printing elements lying on this base. The base need not be continuous.

For processing in the apparatus of the invention, the imaged flexographic printing elements are attached to a transport strip by the edge at the front in transport direction and are then placed onto the two transport elements at the start of the transport device (T1). At the end of the transport device (T1), the washed out flexographic printing plates are taken over by a further transport device.

The attachment of the transport strips (14) to the flexographic printing elements may be accomplished, for example, by perforating the flexographic printing elements along the leading edge, by means of a plate punch, and hanging them into transport strip pins that are disposed in accordance with the punched pattern. In another embodiment, the transport strip may be a clamping strip into which the flexographic printing elements can be clamped.

The plate punch may be an external, separately arranged plate punch, and the operation of hanging the elements into the transport device may be done manually.

The device of the invention may also, however, comprise a loading unit (12) into which only the flexographic printing elements for processing are introduced, and the flexographic printing elements are automatically perforated and hung into the transport device.

This may be accomplished, for example, by laying the transport strip (14) into a recess in the input region and introducing the flexographic printing elements into the input device as far as a stopping bar, automatically or by hand. The plate can be fixed on the leading edge by means of a hold-down member and punched at the same time. Thereafter the stopping bar is raised again. The transport strip is now conveyed with register accuracy beneath the plate, so that the punched holes come to lie exactly over the pins of the transport strip. The transport strip is subsequently pressed upward and the connection is produced.

The insertion of the transport strip may take place manually or else automatically from a supply unit. As a further option, the automatic transport of the transport strips from the delivery region into the supply unit may involve a conveyor belt or other suitable transport system.

The flexographic printing elements provided on the facing side with the transport strip (14) can subsequently be run up in succession to the start of the transport device (T1). They are then automatically captured by the catches and transported.

The preferred device of the invention further comprises a main exposure unit (2), disposed above the transport device (T1), and an exposure unit for preliminary reverse exposure (1), disposed below the transport device.

In one embodiment of the invention, the main exposure unit (2) and the reverse exposure unit (1) may be height-adjustable in their arrangement, allowing the distance between the exposure unit and the plate surface to be varied. In this way, the intensity of exposure can be varied easily.

In the region of the "preliminary reverse exposure" module (1), the transport device may have a base composed of a UV-transparent material, such as of UV-transparent glass, fused silica, or PMMA.

The UV light sources in the main exposure unit (2) and in the unit for preliminary reverse exposure (1) may in principle be any desired light sources, examples being UV tubes or UV-LEDs, in which case UV-LEDs are arranged, in a manner known in principle, in the form of diode arrays. In accordance with the invention, the power of the UV light sources is regulatable. They are preferably UV-LEDs. In one embodiment, the main exposure unit may comprise a diffusion disk. This allows the UV light to be scattered and the irradiated area increased, or the uniformity of the radiant intensity over the irradiated area to be improved.

The distance between the surface of the flexographic printing element and the UV-LEDs can be kept small and amounts customarily to 2 to 100 mm, preferably 2 to 20 mm, and, for example, 2 to 10 mm. The radiation from UV-LEDs has virtually no IR fraction, and so a high intensity with low distance from the flexographic printing element is also possible, without the risk of excessive thermal loading of the flexographic printing element.

In the case of other UV sources, owing to the IR fractions in the radiation emitted, larger distances must of course be maintained.

The main exposure unit (2) and the unit for preliminary reverse exposure (1) may be disposed opposite one another as shown in FIG. 1, so that main exposure and preliminary reverse exposure take place simultaneously. In another embodiment of the device of the invention, represented in FIG. 2, the unit for preliminary reverse exposure (1) may be disposed ahead of the main exposure (2) in transport direction.

In the edge regions of the flexographic printing element, exposure ought to take place only in the width of the flexographic printing element, in order to avoid scattered-light effects. Advantageously, therefore, the exposure unit has shutters which reduce the exposure width to the width of the flexographic printing element.

The device of the invention further comprises at least one washout unit (5). The unit is disposed in such a way that after preliminary reverse exposure and main exposure, an imagewise-exposed flexographic printing element enters the washout unit (5). In the washout unit, the residues of the digitally imagable layer—for example, residues of the laser-ablatable mask layer—and also the unpolymerized fractions of the relief-forming layer are removed using suitable washout media.

Where the flexographic printing element used still comprises further layers arranged above the relief-forming layer, such layers are likewise removed.

The nature of the washout media is governed by the nature of the flexographic printing elements to be processed. Depending on the nature of the relief-forming layer, aqueous washout media or organic washout media may be used. Washout media may of course also comprise mixtures of different solvents and also, optionally, adjuvants such as antistats, for example.

For this purpose, in a customary way, the washout unit may comprise a trough for receiving the washout media, feeds and drains for washout media, and washout brushes. Mounted advantageously in the region below the brushes is a base for the flexographic printing elements, such as a perforated metal sheet, for example. In an alternative embodiment, a metal sheet may be located beneath each brush unit, but no base in the space between the brush units.

In this way, the solvent is able to flow off more effectively. The flexographic printing elements for washout can be drawn through the trough by means of the transport device depicted. The washout brushes serve for mechanical assistance of the washout process.

The device of the invention may also comprise more than one washout unit (5), more particularly two washout units, with preferably each of the washout units possessing its own solvent circuit. This construction allows the exposed flexographic printing element to be washed out using different washout media.

In this way, for example, account may be taken of a difference in polarity between laser-ablatable layer and relief-forming layer. Standard commercial, digitally imagable flexographic printing elements frequently comprise a laser-ablatable mask layer which, owing to the binders typically used, such as elastomeric polyamides, is significantly more polar than the photopolymerizable layer soluble in organic solvents. When using a device having two washout units, it is possible, advantageously, to washout the residues of the laser-ablatable mask layer with a polar washout medium, and the imagewise-exposed, photopolymerizable layer with an apolar washout medium.

In accordance with the invention, the device further comprises a control unit (11) for control of the device. With the control unit (11), it is possible to control at least the speed of the transport device (T1), the power and/or exposure time of the unit for preliminary reverse exposure (1), and the power and/or exposure time of the main exposure unit (2). Since the washout unit (5) has a fixed geometry, the speed of the transport device (T1) determines the washout time available for the exposed flexographic printing element. Optionally, of course, further functions of the device as well may also be controlled by the control unit.

"Drying—Aftertreatment" Module

In the first preferred embodiment, the device of the invention comprises, in addition to the transport device (T1), a second, discontinuously operating transport device (T2), with which the washed out flexographic printing plates are transported at least into the drying unit (7), the aftertreatment unit (9), and the storage unit (10), the flexographic printing plates, washed out but still wet, being transferred from the transport device (T1) to the transport device (T2) in a transfer unit (6).

This embodiment is reproduced diagrammatically in FIGS. 1 and 2; details are found in FIGS. 4, 5, 6, 7, and 8.

In the transfer unit (6), the flexographic printing plates are taken from the transport device (T1) and laid down on a movable underlayer (17). The movable underlayer (17) serves as support for the flexographic printing plate and is moved by the transport device (T2).

In one preferred embodiment of the invention, the movable underlayer (17) is mounted on rollers (see FIG. 8). The movable underlayer preferably further comprises, on the underside, a coupling (19) which can be grasped by a suitable mechanism of the transport device (T2) for the horizontal displacement of the movable underlayer (17). In this embodiment, the transfer unit (6), the dryer (7), the aftertreatment unit (9), and—where present—the storage unit (10) each comprise guide rails (20) on which the movable underlayer (17) comprising rollers can be displaced horizontally.

Of course, alternative embodiments of the movable underlayer (17) are possible, such as a movable underlayer comprising no rollers, which instead slides in the guide rails (20), for example.

The empty movable underlayers (17) that are needed may be kept in reserve in the storage unit (10), for example. In one embodiment of the invention, the device may further comprise a store unit (8) for movable underlayers (17), which is sited preferably below the transfer unit (6).

In one preferred embodiment, the transfer unit (6), the drying unit (7), and, optionally, the store unit (8) are disposed—as seen in processing direction—ahead of the transport unit (T2), with the transfer unit (6) disposed in the middle, the drying unit (7) above and the store unit (8)— where present—below the transfer unit, and the aftertreatment unit (9) and the storage unit (10) are disposed—as viewed in processing direction—behind the transport unit (T2), the aftertreatment unit (9) preferably being disposed above the storage unit (10).

The transport device (T2) comprises a support structure (24) which houses the functional elements of the transport device (T2). The transport device (T2) enables the movable underlayers for the flexographic printing plates to be displaced in vertical and horizontal direction. Depending on individual operation, there may be a flexographic printing plate on each of the movable underlayers (17), or the movable underlayer (17) may be empty. Vertical displacement takes place within the support structure (24) by means of a suitable drive. Horizontal displacement takes place, for example, by means of extendable and retractable arms, which are able to couple to the movable underlayers (17) by means of a suitable mechanism—mechanically or magnetically, for example. In this way, the movable underlayers can be displaced from the transport device (T2) into the adjacent processing units outlined above, and recovered again.

The drying unit (7) generally comprises a plurality of drying compartments which are disposed one above another and which are able each to accommodate one flexographic printing plate—lying on a movable underlayer (17). It is possible therefore for a plurality of flexographic printing plates to be dried at the same time. The drying compartments each possess a mechanism, such as a pneumatically operated flap, for the closing and opening of the drying compartment. The drying unit (7) may comprise 5 to 15 drying compartments, for example.

The drying compartments are preferably each operated self-sufficiently; in other words, each drying compartment possesses its own heating elements, regulation, and monitoring. Advantageously, therefore, the drying conditions, especially the temperature, can be set individually for each flexographic printing plate to be dried, or else individual drying compartments can be switched off in the case of a defect or for energy saving in the event of low capacity utilization.

The storage unit (10) and the store unit (8) as well possess the facility to accommodate a plurality of movable underlayers (17) disposed one above another. The storage unit (10), for example, may accommodate 10 to 20 movable underlayers (17). The storage unit may have rails disposed one above another—in a suitable rack—into which the movable underlayers are inserted.

In the aftertreatment unit (9), the facing side of washed out and dried flexographic printing plates may be irradiated with UVA and/or UVC light in a manner known in principle. Examples of suitable UV light sources include UV tubes or UV-LEDs.

In the transfer unit (6), the washed out flexographic printing plates are taken from the transport device (T1) and laid down onto movable underlayers (17). The procedure is represented diagrammatically in FIGS. 4, 5, and 6.

FIG. 4 shows, diagrammatically, the transfer unit (6) in cross section. A washed out flexographic printing plate (3) with transport strip (14) mounted lies at the end of the washout unit (5) still on the base plane (21) of the washout unit (5). Beneath the end of the transport unit (T1) (all that is shown in the perspective view in FIG. 4) is a spindle which moves the transport strip (14)) there is a movable underlayer (17), which is held in the guide rail (20), and can be moved horizontally on the guide rail. The difference in height between the base plane (21) and the surface of the movable underlayer (17) is just a few mm, such as 10 mm to 40 mm, for example.

FIG. 5 shows the transfer unit (6) in a perspective representation. The washed out flexographic printing plate (3) is hung with the transport strip (14) into the transport device (T1) (in this perspective view there are two spindles visible, into which the transport strip is hung for transport) and lies still on the base plane (21) of the washout unit (5). A movable underlayer (17) is located beneath.

FIG. 6 shows the actual transfer. The washed out flexographic printing plate (3) is drawn from the transport device (T1) out over the end of the base plane (21) of the washout unit. At the end of the transport device, the transport strip (14) separates from the transport device (T1) and slides, together with the connected flexographic printing plate (3), onto the movable underlayer (17). The movable underlayer (17), with the washed out flexographic printing plate (3) thereon, can then be captured by the transport device (T2) and inserted into the transport device (T2), by means of the above-outlined gripping device, for example.

In one embodiment of the invention, the transport device (T2) comprises a mount (16) which is mounted horizontally within the support structure (24) and which is able to accommodate a movable underlayer (17) for flexographic printing plates, and which can be moved vertically within the support structure by means of a suitable drive.

An embodiment of this kind is represented diagrammatically in FIG. 7. The support structure may in particular be cuboidal, with the edges of the cuboid representing suitable supports. The support structure (24) may comprise, for example, four perpendicularly extending, rotatable spindles, which are driven synchronously by a suitable drive. The horizontally mounted mount (16) may have counter-threads matching the spindles, with the spindles extending in these threads, so that the mount (16) changes the height when the spindles are rotated. The horizontal mount (16) may in particular have guide rails (20) on which movable underlayers (17) can be held. For the preferred case where the movable underlayers (17) have rollers, the movable underlayers can roll into the guide rails.

The mount (16) further comprises a displacement device (18) with which movable underlayers (17) can be displaced in each case horizontally from the transport device (T2) into the transfer unit (6), the dryer (7), the aftertreatment unit (9), and the storage unit (10), and/or retrieved from said units.

To hold the movable underlayer (17), the mount (16), the transfer unit (6), the dryer (7), the aftertreatment unit (9), and the storage unit (10) each comprise guide rails (20), on which the movable underlayer (17) can be displaced horizontally. Moreover, the guide rails in the respective units may each comprise stoppers, with which the position of the movable underlayer can be fixed. These may be pneumatically operated stoppers, for example, which lock the running rollers or runners of the movable underlayers (17).

The displacement device (18) comprises an automatically controlled coupling device (23) which, for the purpose of displacement, may be connected reversibly to corresponding couplings (19) on the underside of the movable underlayer (17). A coupling device of this kind may operate magnetically or mechanically, for example. One example of a mechanic coupling is shown diagrammatically in FIG. 8). The displacement device (18), after entry into the coupling (19), extends pegs on the underside of the movable underlayer (17), so that the displacement device (18) is firmly connected to the movable underlayer (17).

In one embodiment of the invention, the transport device (T2) transports the flexographic printing plates as follows: the transport device (T2) draws a movable underlayer (17) bearing a washed out but still wet flexographic printing plate from the transfer unit (6) into the transport device (T2). There it is moved upward and, on reaching the correct height, is displaced into an empty drying compartment of the drying unit (7). The drying time is governed by the nature of the flexographic printing element to be dried and by the drying conditions, and can be set individually for each flexographic printing element to be dried. After the end of drying, the movable underlayer (17) bearing a dried flexographic printing plate is inserted again from the drying compartment into the transport device (T2), moved where necessary to a different height, and then pushed into the aftertreatment unit (9) for aftertreatment with UVA and/or UVC light. Following the aftertreatment, the movable underlayer bearing the flexographic printing plate is removed from the aftertreatment unit (9), moved downward in the transport device (T2), and displaced into an empty compartment of the storage unit (10).

The completed flexographic printing plate may be taken manually from the storage unit. In one embodiment, the movable underlayers are displaced by the transport device (T2) into a delivery unit.

After the completed flexographic printing plate has been removed, the transport strip (14) can be removed manually. Alternatively, the device of the invention may be equipped with a device for the automatic removal of the transport strip (14). In that case the transport rail is angled and is pressed against an opposing construction with recesses for the transport nipples.

In one embodiment of the inventions, the empty transport strips may be transported back automatically, via a conveyor belt or a suitable transport device, into a reserve unit at the beginning of the system.

Empty movable underlayers (17) for receiving a new flexographic printing plate from the transfer unit (6) may be taken—where present—from the separate store unit (8) and transferred by means of the transport unit (T2) into the transfer unit (6). Alternatively, empty movable underlayers (17) may also be stored in compartments of the storage unit (10) and transferred from there into the transfer unit (6) by means of the transport unit (T2).

SECOND PREFERRED EMBODIMENT

In a second preferred embodiment of the invention, the "exposure—washout" module, comprising a continuously operating transport device (T1), is constructed in just the same way as in the first preferred embodiment. In this regard, reference is made to the observations above.

The device differs, however, in relation to the construction of the "drying—aftertreatment" module and the transport of the flexographic printing plates within this module. The construction of the second preferred embodiment is represented diagrammatically in FIG. 9. FIG. 9 shows, diagrammatically, the units for preliminary reverse exposure (1), the unit for main exposure (2), and the washout unit (5).

Disposed in succession following the washout unit (5) are the drying unit (7), the aftertreatment unit (9), and a storage unit (10); the aftertreatment unit (9), therefore, is disposed between the drying unit (7) and the storage unit (10).

In the case of the second preferred embodiment, the drying unit (7) comprises at least two compartments, disposed one above another, for receiving washed out flexographic printing plates. Preferably there are two or more compartments disposed one above another, such as 5 to 15 compartments, for example. The drying compartments each possess on both sides a mechanism—a pneumatically operated flap, for example—for closing and opening the drying compartment. In accordance with the invention, the compartments may be moved vertically within the drying unit (7) by means of a suitable drive.

The storage unit (10) as well comprises at least two compartments, disposed one above another, for receiving completed flexographic printing plates. Preferably there are two or more compartments disposed one above another, such as 5 to 15 compartments, for example. In accordance with the invention, the compartments may be moved vertically within the storage unit (10) by means of a suitable drive.

For the transport of the flexographic printing elements, the device in the second preferred embodiment comprises a second, discontinuously operating transport device (T3), comprising at least one gripping device (25) which is fixed in the aftertreatment unit (9) and with which the flexographic printing plates can be gripped on the transport strip (14).

By means of the gripping device described, the flexographic printing elements can be taken out at the outlet of the washout unit (5) of the transport device (T1) and displaced horizontally into the dryer (7), the aftertreatment unit (9), and the storage unit (10). The gripping device (25) may comprise, for example, a displaceable frame which at both ends has gripping or clamping devices which are able to surround and pull the transport strip.

In the case of transport using the transport device (T3), the flexographic printing element remains on one plane. For drying in the drying unit (7), the drying compartments of the dryer are initially—where necessary—shifted by means of the vertical shifting facility in such a way that an empty drying compartment is located on the transport plane. The gripping device then reaches through the opened drying compartment and pulls the flexographic printing element for drying, on the transport strip (14), into the drying compartment. After drying, the drying compartments must be set again in such a way that the compartment with the fully-dried flexographic printing plate is located on the transport plane, and then the compartment can be opened and the flexographic printing plate can be drawn into the aftertreatment unit (9). After the aftertreatment, the compartments of the storage unit (10) are set such that there is an empty storage compartment on the transport plane, after which the aftertreated flexographic printing element can be displaced by means of the gripping device from the aftertreatment unit (9) into the storage unit (19).

THIRD PREFERRED EMBODIMENT

The third preferred embodiment corresponds largely to the second preferred embodiment. Reference is made to the observations above. In contrast to the above-described second preferred embodiment, however, the device possesses not only the continuously operating transport device (T1) but also two transport devices (T4) and (T5) which operate in each case discontinuously and independently of one another.

The discontinuously operating transport device (T4) comprises at least one gripping device (25) which is fixed in the outlet of the washout unit (5) and with which the washed out flexographic printing plates can be gripped on the transport strip (14). By means of the transport device (T4), the flexographic printing elements can be taken from the transport device (T1) at the outlet of the washout unit (5) and displaced horizontally into the dryer (7).

The discontinuously operating transport device (T5) comprises at least one gripping device (25) which is fixed in the aftertreatment unit (9) and with which the flexographic printing plates can be gripped on the transport strip (14), taken from the dryer (7), and displaced horizontally into the aftertreatment unit (9) and also the storage unit (10).

The functioning of the device corresponds otherwise to the second preferred embodiment. The use of two transport devices (T4) and (T5) operating separately from one another does signify a greater complexity of apparatus, but has the advantage that it boosts the processing capacity of the system.

Modular Construction

In one embodiment of the invention, the device can be constructed such that it is assembled from at least two modules, the modules each being also self-functional on their own.

The base module in this case is the above-described "exposure—washout" module, comprising a continuously operating transport device (T1). This module can be operated separately, and the washed out flexographic printing plates can be subjected subsequently to conventional drying and aftertreatment.

The stated base module may be supplemented by the operators of the system with further modules. A supplementary module in one embodiment is the above-described "drying—aftertreatment" module, with a discontinuous transport device (T2), or, alternatively, the "drying—aftertreatment" modules described for the second to fourth preferred embodiments.

It is also conceivable for the "drying—aftertreatment" module to be broken down into two submodules, namely a "drying" submodule comprising a drying unit (7) and a transport device (T2) and an "aftertreatment—storage" submodule comprising an aftertreatment unit (9) and a storage unit (10). The combination of the base module and the "drying" submodule may be used for exposure, washout, and drying, and the dried flexographic printing plates may be subsequently supplied manually to a secondary exposure unit. Combination with the "aftertreatment—storage" submodule gives the complete apparatus described above.

Method of the Invention

The device described can be used for continuous processing of flexographic printing elements into flexographic printing plates.

For the method of the invention, the starting material used is a digitally imagable flexographic printing element comprising at least one UV-transparent, dimensionally stable support sheet, a photopolymerizable, relief-forming layer, and a digitally imagable layer, and is processed to a print-ready flexographic printing plate.

The flexographic printing element described is preferably used with a PET sheet featuring low shrinkage.

The method comprises, in a manner known in principle, at least the following method steps (i) writing a mask into the digitally imagable layer, (ii) carrying out preliminary reverse exposure of the imaged flexographic printing element with UV radiation through the support sheet,
(iii) exposing the imaged flexographic printing element with UV radiation through the mask formed,
(iv) removing the residues of the digitally imagable layer and also the unpolymerized fractions of the relief-forming layer, using washout media,
(v) drying the resultant flexographic printing plate,
(vi) aftertreating the flexographic printing plate UVA and/or UVC light.

In accordance with the invention, at least method steps (ii), (iii), (iv), (v), and (vi) are carried out using the device described.

In one embodiment of the method, a device is employed which further comprises a unit for digital imaging, more particularly a unit for writing a mask into a laser-ablatable layer, and method step (i) as well is performed using the device.

In one preferred embodiment of the method, a device as per one of the above-outlined preferred embodiments of the device is employed, more preferably a device as per the first preferred embodiment.

Given that the washout of the exposed flexographic printing elements in the washout unit (5) is the rate-determining step in comparison to the main exposure and reverse exposure, the transport speed of the transport device (T1) is governed by the necessary washout time, and specifically the transport speed is selected such that the dwell time of the flexographic printing element to be washed out in the washout unit (5) is at least long enough to ensure complete removal of the unpolymerized fractions of the relief-forming layer. The dwell time may also be longer, but may not be shorter than the minimum time described.

The washout time for a flexographic printing element is governed essentially by the thickness of the flexographic printing element, its construction, and the nature and temperature of the washout medium used. The conditions are selected accordingly by the skilled person. For commercially available flexographic printing elements, tables exist with recommended washout speeds; otherwise, the optimum washout speeds can easily be determined by the skilled person.

The transport speed is generally—depending on plate thickness—50 mm/min to 900 mm/min. The minimum figure of 50 mm/min may be necessary when developing very thick plates, whereas thin plates may sometimes be developed and/or washed out at up to 900 mm/min.

Where different flexographic printing elements are processed, especially flexographic printing elements with different thicknesses, the speed of the transport device (T1) is governed by the flexographic printing element having the longest washout time.

In one embodiment, the speed of the transport device (T1) is set at a fixed figure by means of the control unit (11), and the power and/or exposure time of the exposure unit for preliminary reverse exposure (1), and the power and/or exposure time of the exposure unit for main exposure (2), are set in accordance with the transport speed and with the particular plate to be processed.

In view of the set transport speed, the time required by the flexographic printing element to pass through the modules for preliminary reverse exposure and for main exposure is fixed, and hence, automatically, the maximum possible exposure time in each case is also fixed. As seen, the transport speeds may differ by a factor of 10, and accordingly the maximum possible exposure times as well may be different by a factor of 10.

In accordance with the invention, the control unit (11) adapts the power of the UV sources for preliminary reverse exposure and for main exposure in line with the fixed exposure time in such a way that there is satisfactory imagewise crosslinking of the relief-forming layer.

Further processing of the flexographic printing elements after washout takes place as already outlined above.

Preferred Flexographic Printing Elements for Processing with the Device of the Invention For processing with the device of the invention, use may be made in principle of all photopolymerizable flexographic printing elements which comprise at least one dimensionally stable support, a relief-forming, photopolymerizable layer—which preferably can be washed out in organic washout media—and a digitally imagable layer.

Digitally imagable flexographic printing elements in plate form are known in principle to the skilled person and are available commercially. Examples of such flexographic printing elements are described in U.S. Pat. No. 5,262,275, EP-A 1 069 475, WO 2008/095994 A1, WO 2009/141256 A1 or WO 2012/010459 A1, for example. The skilled person makes an appropriate selection according to the desired properties of the flexographic printing plate.

For processing in the device of the invention, flexographic printing elements having a support sheet with a thickness of 50 to 300 µm may preferably be used. As a general rule, the support sheet is composed of a material which is at least partly transparent for UV light, in order to allow the preliminary reverse exposure of the flexographic printing element. PET sheets are especially suitable.

In a manner known in principle, the photopolymerizable, relief-forming layer comprises at least one elastomeric binder, an ethylenically unsaturated monomer, and also a photoinitiator or a photoinitiator system. Besides the components stated, there may also, optionally, be further components present, such as plasticizers, for example. The layer in question is preferably soluble in organic washout media, although of course flexographic printing elements with water-soluble, relief-forming layers can also be processed in the device of the invention. The elastomeric binders may be, for example, thermoplastic elastomeric block copolymers, examples being styrene-butadiene or styrene-isoprene block copolymers. The relief-forming layer generally has a layer thickness of 300 µm to 7000 µm, preferably 1000 µm to 5000 µm. Flexographic printing elements that are used may of course also comprise, one above another, two or more photopolymerizable, relief-forming layers differing in their composition.

The digitally imagable layer may be, for example, a laser-ablatable layer, a layer which can be written using inkjet printers, or a thermographic layer. Preferably it is a laser-ablatable layer.

The laser-ablatable mask layer, also called LAMS layer, comprises at least one elastic binder, more particularly an elastomeric binder. Mixtures of two or more different binders may of course also be used. Examples of suitable binders include elastomeric polyamides. The monomeric building blocks of such polyamides include long-chain, difunctional fatty acids, which give the polyamide elastomeric properties. Moreover, polyester amides, cellulose derivatives, nitrocellulose, polyvinyl alcohols, polyvinyl acetate, ethylene-vinyl acetate copolymers, polyacrylates, or mixtures of the stated polymers may be used, provided that they possess elastomeric properties.

The laser-ablatable mask layer further comprises UV-absorbing materials. A particularly suitable UV-absorbing material is finely divided carbon black. Carbon black also absorbs very well in the IR range and therefore ensures rapid imaging at the same time when carrying out imaging by IR laser. Of course, however, the laser-ablatable mask layer may also comprise other UV or IR absorbers, based on pigment, or soluble dyes. Carbon black is present usually in an amount of 10 to 50 wt %, relative to the sum total of all the components. The thickness of the mask layer ought to be a few μm, preferably 1 μm to 4 μm.

To protect the mask layer, the flexographic printing element normally has a cover sheet.

Furthermore, the flexographic printing element may optionally comprise further layers, such as elastic underlayers, tie layers or disbanding layers, for example.

Disposed between the photopolymerizable layer and the laser-ablatable layer, moreover, may optionally be an oxygen barrier layer which is transparent to UVA light. During exposure, a layer of this kind limits or prevents the diffusion of oxygen into the photopolymerizable layer, and therefore contributes to a better printed image. In a manner known in principle, the barrier layer may comprise a polymeric binder having low permeability to oxygen. Examples of suitable binders include polyamides, polyvinyl alcohol, hydroxyalkylcellulose, polyvinylpyrrolidone, polyvinyl acetate, ethylene-vinyl acetate copolymers, amphoteric interpolymers, cellulose acetate butyrate, alkylcellulose, butyral, cyclic rubbers, or combinations thereof. A barrier layer usually has a layer thickness of 0.3 μm to 5 μm. Further details of barrier layers are disclosed in U.S. Pat. No. 5,262,275 or WO 2012/145111 A1, for example.

The invention claimed is:

1. A device for producing flexographic printing plates starting from digitally imagable flexographic printing elements comprising at least one dimensionally stable support sheet, a photopolymerizable, relief-forming layer, and a digitally imaged layer, comprising at least
    an exposure unit (1) for the preliminary exposure of the flexographic printing elements from the reverse by means of UV radiation,
    an exposure unit (2) for the main exposure of the flexographic printing elements by means of UV radiation through the digitally imaged layer,
    a washout unit (5) for removing the residues of the digitally imaged layer and also the unpolymerized fractions of the relief-forming layer, using washout media,
    a drying unit (7) for drying the washed out flexographic printing plates,
    an aftertreatment unit (9) for aftertreating the dried flexographic printing plates with UVA and/or UVC light,
    a storage unit (10) for accommodating the completed flexographic printing plates,
    a control unit (11) for control in the device,
wherein the device comprises at least two different transport devices (T) for transporting the flexographic printing elements and flexographic printing plates, respectively, through the system,
where one of the devices (T) is a continuously operating transport device (T1) set up so as to transport flexographic printing elements through the exposure units (1) and (2) and also the washout unit (5), wherein the continuously operating transport device (T1) comprises two transport elements (13) extending parallel to one another in transport direction, the flexographic printing elements being connected to a transport strip (14), which is set up to be hung by its respective ends (15) into the transport elements (13) and where
    a) the device comprises, as well as the continuously operating transport device (T1), a second, discontinuously operating transport device (T2, T3), the flexographic printing plates being transported by the second, discontinuously operating transport device (T2, T3) into the drying unit (7), into the aftertreatment unit (9), and also the storage unit (10), wherein at the end of the continuously operating transport device (T1), the transport strip (14) separates from the transport device (T1) and the flexographic printing plate with the transport strip (14) is inserted into the second, discontinuously operating transport device (T2, T3) or
    b) the device comprises, as well as the continuously operating transport device (T1), a second, discontinuously operating transport device (T4) and a third, discontinuously operating transport device (T5), the flexographic printing plates being transported by the second, discontinuously operating transport device (T4) into the drying unit (7) and by the third, discontinuously operating transport device (T5) into the aftertreatment unit (9) and also the storage unit (10).

2. The device as claimed in claim 1, wherein the device further comprises a digital imaging unit disposed ahead of the exposure and preliminary reverse exposure unit in transport direction.

3. The device as claimed in claim 1, wherein
    the exposure unit (1) is disposed below the transport device (T1) and comprises at least one UV source regulatable in its power,
    the exposure unit (2) is disposed above the transport device (T1) and comprises at least one UV source regulatable in its power, with the proviso that the exposure unit (2) is disposed after the exposure unit (1) in transport direction or that the exposure units (1) and (2) are disposed opposite one another,
    and the control unit (11) is set up so as to regulate at least the transport speed of the transport device (T1), the power and/or exposure time of the exposure unit (1) for preliminary reverse exposure, and the power and/or exposure time of the exposure unit (2) for main exposure.

4. The device as claimed in claim 3, wherein the UV source in the exposure unit (1) for preliminary reverse exposure comprises UV-LEDs and/or that the UV source in the unit (2) for main exposure comprises UV-LEDs.

5. The device as claimed in claim 3, wherein the exposure unit (2) and/or the preliminary reverse exposure unit (1) are height-adjustable.

6. The device as claimed in claim 1, wherein the washout unit (5) comprises two separate washing zones.

7. The device as claimed claim 1, wherein the device further comprises a loading unit (12) which is set up so as to load the transport device (T1) automatically with flexographic printing elements and in that the loading unit comprises a punch which is set up to punch the flexographic printing elements and subsequently to connect the punched flexographic printing elements to a transport strip (14).

8. The device as claimed in claim 1, wherein the flexographic printing plates are transported by the second transport device (T2) as per alternative a) into the drying unit (7), the aftertreatment unit (9), and also the storage unit (10), the flexographic printing plates being transferred from the continuous transport device (T1) onto the second transport device (T2) in a transfer unit (6).

9. The device as claimed in claim 8, wherein the second transport device (T2) is set up to accommodate a movable underlayer (17) for flexographic printing plates, the movable underlayer being displaceable horizontally and vertically by means of an appropriate construction, thus allowing the movable underlayers (17) to be displaced in each case from the transport device (T2) into the transfer unit (6), the dryer (7), the aftertreatment unit (9), and the storage unit (10), and/or to be retrieved from said units.

10. The device as claimed in claim 9, wherein the movable underlayer (17) is mounted on rollers, and the transfer unit (6), the dryer (7), the aftertreatment unit (9), and the storage unit (10) each comprise guide rails (20) on which the movable underlayer (17) can be displaced horizontally.

11. The device as claimed in claim 9, wherein the transport device (T2) comprises a displacement device (18) comprising an automatically controlled coupling device (23) which for displacement can be connected reversibly to corresponding couplings (19) on the underside of the movable underlayer (17).

12. The device as claimed in claim 9, wherein the transfer unit (6) is set up to lay down the flexographic printing plate onto a movable underlayer (17) in the transfer unit (6).

13. The device as claimed in claim 9, wherein the device further comprises a store unit (8) for movable underlayers (17).

14. The device as claimed in claim 9, wherein the drying unit (7) comprises a plurality of compartments disposed one above another for accommodating flexographic printing plates and that the compartments of the drying unit (7) each possess their own heating elements and their own regulation.

15. The device as claimed in claim 9, wherein the device is constructed of at least two modules which can be separated from one another and which are each also set up for separate operation.

16. The device as claimed in claim 15, wherein the device comprises a base "exposure-washout" module, comprising
    an exposure unit (1) for preliminary exposure of the flexographic printing elements from the reverse by means of UV radiation,
    an exposure unit (2) for the main exposure of the flexographic printing elements by means of UV radiation through the digitally imaged layer, and also
    a washout unit (5) for removing the residues of the digitally imaged layer and also the unpolymerized fractions of the relief-forming layer, using washout media, and
    a continuously operating transport device (T1) with which the flexographic printing elements are transported through the exposure units (1) and (2) and also the washout unit (3).

17. The device as claimed in claim 16, wherein the device comprises a "drying-aftertreatment" module, comprising
    a drying unit (7),
    an aftertreatment unit (9),
    a storage unit (10),
    a discontinuously operating transport device (T2), and
    a transfer unit (6) in which washed out flexographic printing plates are transferred from the transport device (T1) onto the transport device (T2).

18. The device as claimed in claim 1, wherein
    the drying unit (7) comprises at least two compartments disposed one above another for accommodating flexographic printing plates, the compartments being movable vertically within the drying unit (7) by means of a suitable drive,
    the storage unit (10) comprises at least two compartments disposed one above another for accommodating flexographic printing plates, the compartments being movable vertically within the storage unit (10) by means of a suitable drive,
    the aftertreatment unit (9) is disposed between the drying unit (7) and the storage unit, and
    the second, discontinuously operating transport device (T3) as per alternative a) comprises at least one gripping device (25) which is fixed in the aftertreatment unit (9) and with which the flexographic printing plates on a transport strip (14) can be gripped, taken from the transport device (T1) at the outlet of the washout unit (5), and displaced horizontally into the dryer (7), the aftertreatment unit (9), and also the storage unit (10).

19. The device as claimed in claim 1, wherein
    the drying unit (7) comprises at least two compartments disposed one above another for accommodating flexographic printing plates, the compartments being movable vertically within the drying unit (7) by means of a suitable drive,
    the storage unit (10) comprises at least two compartments disposed one above another for accommodating flexographic printing plates, the compartments being movable vertically within the storage unit (10) by means of a suitable drive,
    the aftertreatment unit (9) is disposed between the drying unit (7) and the storage unit,
    the second, discontinuously operating transport device (T4) as per alternative b) comprises at least one gripping device (25), which is fixed in the outlet of the washout unit (5) and with which the flexographic printing plates on a transport strip (14) can be gripped, taken from the transport device (T1) at the outlet of the washout unit (5), and displaced horizontally into the dryer (7), and
    the device comprises the third, discontinuously operating transport device (T5) as per alternative b), comprising at least one gripping device (25), which is fixed in the aftertreatment unit (9) and with which the flexographic printing plates can be gripped on the transport strip (14), taken from the dryer (7), and displaced horizontally into the aftertreatment unit (9), and also the storage unit (10).

20. A method for producing flexographic printing plates starting from digitally imagable flexographic printing elements comprising at least one dimensionally stable support sheet, a photopolymerizable, relief-forming layer, and a digitally imagable layer, comprising at least the following method steps:
    (i) writing a mask into the digitally imagable layer,
    (ii) carrying out preliminary reverse exposure of the imaged flexographic printing element with UV radiation through the support sheet,
    (iii) exposing the imaged flexographic printing element with UV radiation through the mask formed,
    (iv) removing the residues of the digitally imagable layer and also the unpolymerized fractions of the relief-forming layer, using washout media,
    (v) drying the resultant flexographic printing plate,) aftertreating the flexographic printing plate UVA and/or UVC light,
    wherein at least method steps (ii), (iii), (iv), (v) and (vi) are carried out using a device as claimed in claim 1.

21. The method as claimed in claim 20, wherein the washout unit (5) comprises two separate washing zones, which can be operated with different washout media.

22. The method as claimed in claim 20, wherein the compartments of the drying unit (7) each possess their own heating elements and their own regulation, and the drying compartments are operated independently of one another.

23. A device for producing flexographic printing plates starting from digitally imagable flexographic printing elements comprising at least one dimensionally stable support sheet, a photopolymerizable, relief-forming layer, and a digitally imaged layer, comprising at least an exposure unit (1) for the preliminary exposure of the flexographic printing elements from the reverse by means of UV radiation, an exposure unit (2) for the main exposure of the flexographic printing elements by means of UV radiation through the digitally imaged layer, a washout unit (5) for removing the residues of the digitally imaged layer and also the unpolymerized fractions of the relief-forming layer, using washout media, a drying unit (7) for drying the washed out flexographic printing plates, an aftertreatment unit (9) for aftertreating the dried flexographic printing plates with UVA and/or UVC light, a storage unit (10) for accommodating the completed flexographic printing plates, a control unit (11) for control in the device, wherein the device comprises at least two different transport devices (T) for transporting the flexographic printing elements and flexographic printing plates, respectively, through the system, where one of the devices (T) is a continuously operating transport device (T1) set up so as to transport flexographic printing elements through the exposure units (1) and (2) and also the washout unit (5), and where the device comprises, as well as the continuously operating transport device (T1), a second, discontinuously operating transport device (T2, T3), the flexographic printing plates being transported by the second, discontinuously operating transport device (T2, T3) into the drying unit (7), into the aftertreatment unit (9), and also the storage unit (10), and the drying unit (7) comprises at least two compartments disposed one above another for accommodating flexographic printing plates, the compartments being movable vertically within the drying unit (7) by means of a suitable drive, the storage unit (10) comprises at least two compartments disposed one above another for accommodating flexographic printing plates, the compartments being movable vertically within the storage unit (10) by means of a suitable drive, the aftertreatment unit (9) is disposed between the drying unit (7) and the storage unit, and the second, discontinuously operating transport device (T3) as per alternative a) comprises at least one gripping device (25) which is fixed in the aftertreatment unit (9) and with which the flexographic printing plates on a transport strip (14) can be gripped, taken from the transport device (T1) at the outlet of the washout unit (5), and displaced horizontally into the dryer (7), the aftertreatment unit (9), and also the storage unit (10).

* * * * *